United States Patent
Yamagami et al.

(10) Patent No.: US 7,874,850 B2
(45) Date of Patent: Jan. 25, 2011

(54) ELECTRICAL CONNECTOR

(75) Inventors: Hidehisa Yamagami, Kanagawa (JP); Yusuke Mito, Tokyo (JP)

(73) Assignee: Tyco Electronics Japan G.K., Kanagawa-ken (JP)

( * ) Notice: Subject to any disclaimer, the term of this patent is extended or adjusted under 35 U.S.C. 154(b) by 121 days.

(21) Appl. No.: 12/091,115

(22) PCT Filed: Aug. 29, 2006

(86) PCT No.: PCT/JP2006/316985
§ 371 (c)(1),
(2), (4) Date: Apr. 22, 2008

(87) PCT Pub. No.: WO2007/049395
PCT Pub. Date: May 3, 2007

(65) Prior Publication Data
US 2009/0275241 A1    Nov. 5, 2009

(30) Foreign Application Priority Data
Oct. 27, 2005  (JP) .................... 2005-313202

(51) Int. Cl.
*H01R 12/00* (2006.01)
(52) U.S. Cl. ....................................... 439/79
(58) Field of Classification Search .................. 439/79
See application file for complete search history.

(56) References Cited

U.S. PATENT DOCUMENTS

| | | | | |
|---|---|---|---|---|
| 6,193,527 B1 * | 2/2001 | Tsai | ............................ | 439/79 |
| 6,702,593 B2 * | 3/2004 | Ogawa | ........................ | 439/79 |
| 7,059,872 B2 * | 6/2006 | Tanaka et al. | .................. | 439/79 |
| 7,063,545 B2 * | 6/2006 | Zu et al. | ........................ | 439/79 |
| 7,300,290 B2 * | 11/2007 | Yamagami et al. | ............ | 439/79 |

FOREIGN PATENT DOCUMENTS

| | | |
|---|---|---|
| JP | 07-302653 | 11/1995 |
| JP | 11-307201 | 11/1999 |
| JP | 2000-164273 | 6/2000 |

* cited by examiner

*Primary Examiner*—Briggitte R Hammond
(74) *Attorney, Agent, or Firm*—Barley Snyder LLC (57) ABSTRACT

An electrical connector includes an insulating housing provided with a plurality of first contacts. Each of the first contacts has a tine that extends toward an outside of the insulating housing that is bent at a right angle with respect thereto. A tine plate is mounted on a side of the insulating housing. A circuit board is arranged adjacent to the undersurface of the tine plate and spaced there from. The tines extend through first through-holes in the tine plate and first through-holes in the circuit board. The tine plate has at least one first recess provided on the undersurface of the tine plate that encompasses at least one of the first though-holes on the tine plate. Molten solder is provided in the first through-holes in the circuit board and forms a fillet on the tines that extends toward the undersurface of the tine plate.

15 Claims, 10 Drawing Sheets

ELECTRICAL CONNECTOR

CROSS-REFERENCE TO RELATED APPLICATIONS

This application claims the benefit of the filing date under 35 U.S.C. §120 of International Patent Application No. PCT/JP2006/316985 filed Aug. 29, 2006 that claims the benefit of Japanese Patent Application No. 2005-313202 filed Oct. 27, 2005.

FIELD OF THE INVENTION

The present invention relates to an electrical connector comprising a tine plate into which fillet of solder on the tines of the contacts do not encroach when the tines are connected by soldering to a circuit board via the tine plate.

BACKGROUND

Figure 12:
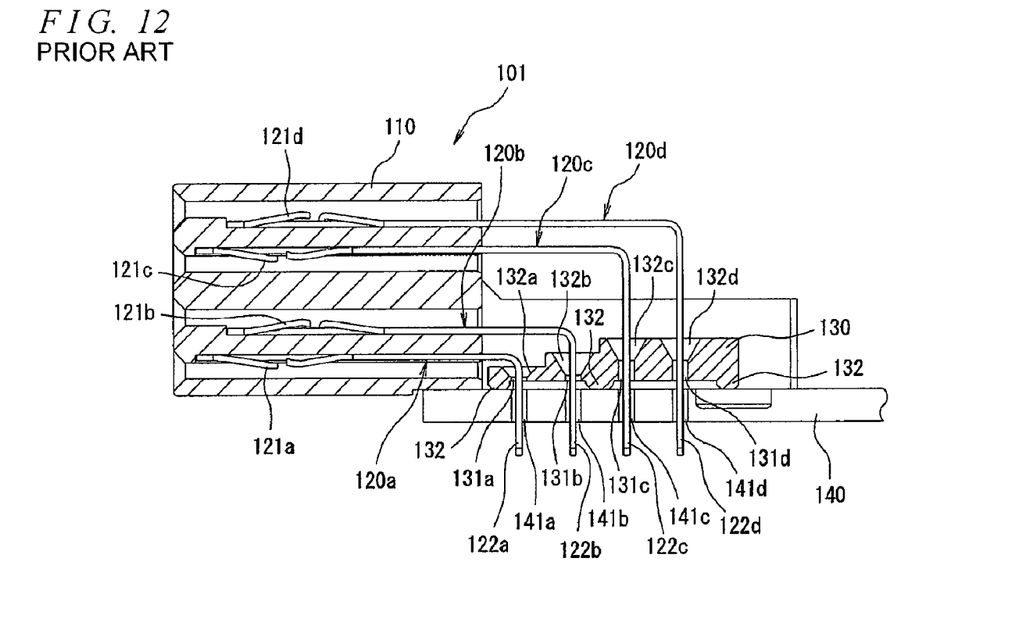
FIG. 12 is a sectional view of a conventional example of an electrical connector.
Figure 13:
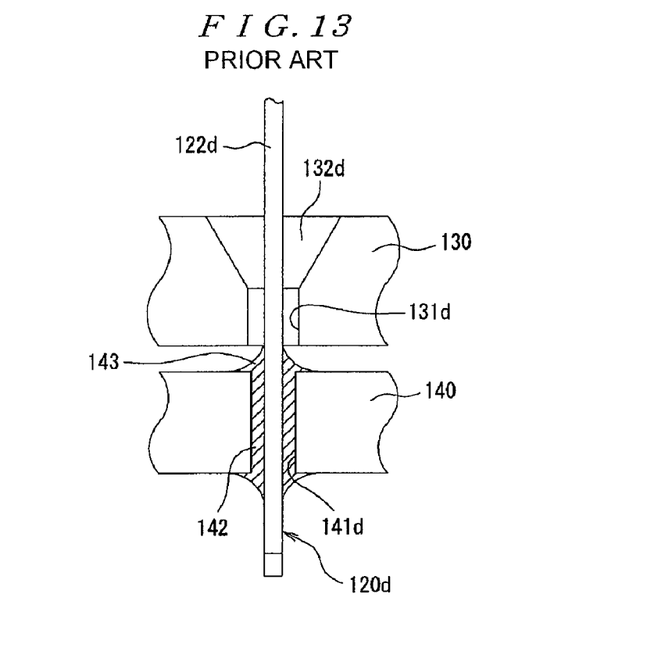
FIG. 13 is an explanatory diagram showing a state in which a tine of a contact in a fourth row of a housing is connected by soldering to a through-hole in a circuit board of the electrical connector shown in FIG. 12.

FIGS. 12 and 13 (see Japanese Patent Application Kokai No. H7-302653) show an example of a conventional electrical connector 101. The electrical connector 101 comprises a tine plate 130 having a construction which is such that solder 142 sufficiently rises into through-holes 141a, 141b, 141c, and 141d in a circuit board 140 when the tines 122a, 12b, 122c, and 122d of contacts 120a, 120b, 120c, and 120d are soldered to the circuit board 140 via the tine plate 130. As shown in FIG. 12, the electrical connector 101 comprises an insulating housing 110 that extends in a direction of length (a direction perpendicular to a plane of the page in FIG. 12), the contacts 120a, 120b, 120c, and 120d that are secured to the housing 110 in four rows in a vertical direction, and the tine plate 130. The contacts 120a, 120b, 120c, and 120d in the four rows respectively comprise contact members 121a, 121b, 121c, and 121d that are fastened to the housing 110 that make contact with mating contacts (not shown in the figures), and tines 122a, 122b, 122c, and 122d. The tines 122a, 122b, 122c, and 122d extend from the contact members 121a, 121b, 121c, and 121d toward a rear of the housing 110 (a direction opposite of a mating surface, i.e., rightward in FIG. 12) and then are bent downward at a right angle. The tines 122a of the contacts 120a in a first row from a bottom of the housing 110 are designed such that the portions of the tines 122a that are bent at a right angle are positioned on an innermost side (leftmost side in FIG. 12 and on the side close to the housing 110) of the housing 110 and are respectively inserted into the through-holes 141a in a first row of the circuit board 140 that are located on the innermost side (leftmost side in FIG. 12 and on the side close to the housing 110) of the housing 110 and are respectively connected by soldering to a conductor layer on inner surfaces of the through-holes 141a. Moreover, the tines 122b of the contacts 120b in a second row from the bottom are designed such that the portions of the tines 122b that are bent at a right angle are located in a second position from the inside and that the tines 122b are respectively inserted into the through-holes 141b in a second row of the circuit board 140 that are located in the second position from the inside and are respectively connected by soldering to a conductor layer on the inner surfaces of the through-holes 141b. In addition, the tines 122c of the contacts 120c in a third row from the bottom are designed such that the portions of the tines 122c that are bent at a right angle are located in a third position from the inside and that the tines 122c are respectively inserted into the through-holes 141c in a third row of the circuit board 140 that are located in the third position from the inside and are respectively connected by soldering to a conductor layer on the inner surfaces of the through-holes 141c. Likewise, the tines 122d of the contacts 120d in a fourth and uppermost row are designed such that the portions of the tines 122d that are bent at a right angle are positioned on an outermost side and that the tines 122d are respectively inserted into the through-holes 141d in a fourth row of the circuit board 140 and are located on the outermost side and are respectively connected by soldering to a conductor layer on the inner surfaces of the through-holes 141d.

The tine plate 130 is constructed from a substantially rectangular plate that extends in the direction of length of the housing 110 and has through-holes 131a, 131b, 131c, and 131d in four rows formed in positions corresponding to the through-holes 141a, 141b, 141c, and 141d in the circuit board 140. Moreover, tapered members 132a, 132b, 132c, and 132d for easily guiding the respective tines 122a, 122b, 122c, and 122d into the through-holes 131a, 131b, 131c, and 131d are provided in the through-holes 131a, 131b, 131c, and 131d on a side of the insertion of the tines. In addition, once the tines 122a, 122b, 122c, and 122d are inserted into the through-holes 131a, 131b, 131c, and 131d in the tine plate 130, the tines 122a, 122b, 122c, and 122d can be respectively aligned with the through-holes 141a, 141b, 141c, and 141d in the circuit board 140.

Projections 132 that extend in the direction of length are respectively provided on an undersurface of the tine plate 130 on an inside of the through-holes 131a in the first row from the inside (on a side close to the housing 110), between the through-holes 131b in the second row from the inside and the through-holes 131c in the third row from the inside, and on the outside of the through-holes 131d in the fourth row on the outermost side. As a result, when the electrical connector 101 is mounted on the circuit board 140 by respectively inserting the tines 122a, 122b, 122c, and 122d into the through-holes 131a, 131b, 131c, and 131d in the tine plate 130, and respectively inserting the tines 122a, 122b, 122c, and 122d protruding from the undersurface of the tine plate 130 into the through-holes 141a, 141b, 141c, and 141d in the circuit board, the projections 132 contact an upper surface of the circuit board 140. This creates a step difference between the upper surface of the circuit board 140 and the undersurface of the tine plate 130, and the through-holes 131a, 131b, 131c, and 131d are positioned in a portion of the lower step. Consequently, a gap is created between the tine plate 130 and the circuit board 140 where the through-holes 131a, 131b, 131c, and 131d are formed in the tine plate 130.

Then, when the tines 122a, 122b, 122c, and 122d are connected by soldering to the through-holes 141a, 141b, 141c, and 141d in the circuit board 140 in a subsequent soldering process, if a reverse side of the circuit board 140 that is mounted on the electrical connector 101 is exposed to a molten solder jet, a capillary action occurs in each of the through-holes 141a, 141b, 141c, and 141d because of the existence of appropriate space inside the through-holes 141a, 141b, 141c, and 141d between the inner walls and the tines 122a, 122b, 122c, and 122d. Accordingly, as is shown in FIG. 13, the solder 142 that is in a molten state moves up inside each of the through-holes 141a, 141b, 141c, and 141d in the circuit board 140 to the upper surface of the circuit board 140 due to the capillary action. The solder 142 further draws up each of the tines 122a, 122b, 122c, and 122d from the upper surface of the circuit board 140 due to the surface tension, and a tip end of the solder 142 in each of the through-holes 141a, 141b, 141c, and 141d forms a fillet 143 that reaches near the tine plate 130. However, the following problem has been encountered in the electrical connector 101. Specifically, the tine plate 130 is designed such that a gap is created between the undersurface of the tine plate 130 and the upper surface of the circuit board 140 by making the plate thickness smaller (thinner) in all portions having the through-holes 131a, 131b, 131c, and 131d; therefore, the surface area of the portions of the tine plate 130 where the gap is created from the circuit board 140 occupies most of the total surface area, creating a problem in that the mechanical strength is insufficient. In particular, when the electrical connector 101 comprising the tine plate 130 is mounted on a circuit board used for an automobile engine control unit, the electrical connector 101 is subjected to a large temperature difference and vibration during use, so that the mechanical strength of the tine plate 130 becomes a problem.

SUMMARY

It is an object of the present invention to provide an electrical connector comprising a tine plate in which the mechanical strength of the tine plate is not lowered, and a fillet of solder drawn up tines arranged in the tine plate can be prevented from encroaching on the tine plate.

This and other objects are achieved by an electrical connector comprising an insulating housing provided with a plurality of first contacts. Each of the first contacts has a tine that extends toward an outside of the insulating housing that is bent at a right angle with respect thereto. A tine plate is mounted on a side of the insulating housing. The tine plate has a plurality of first through-holes that extend from an upper surface to an undersurface of the tine plate. The tines extend through the first through-holes. The tine plate has at least one first recess provided on the undersurface of the tine plate that encompasses at least one of the first though-holes.

DETAILED DESCRIPTION OF THE EMBODIMENT(S)

Figure 1:
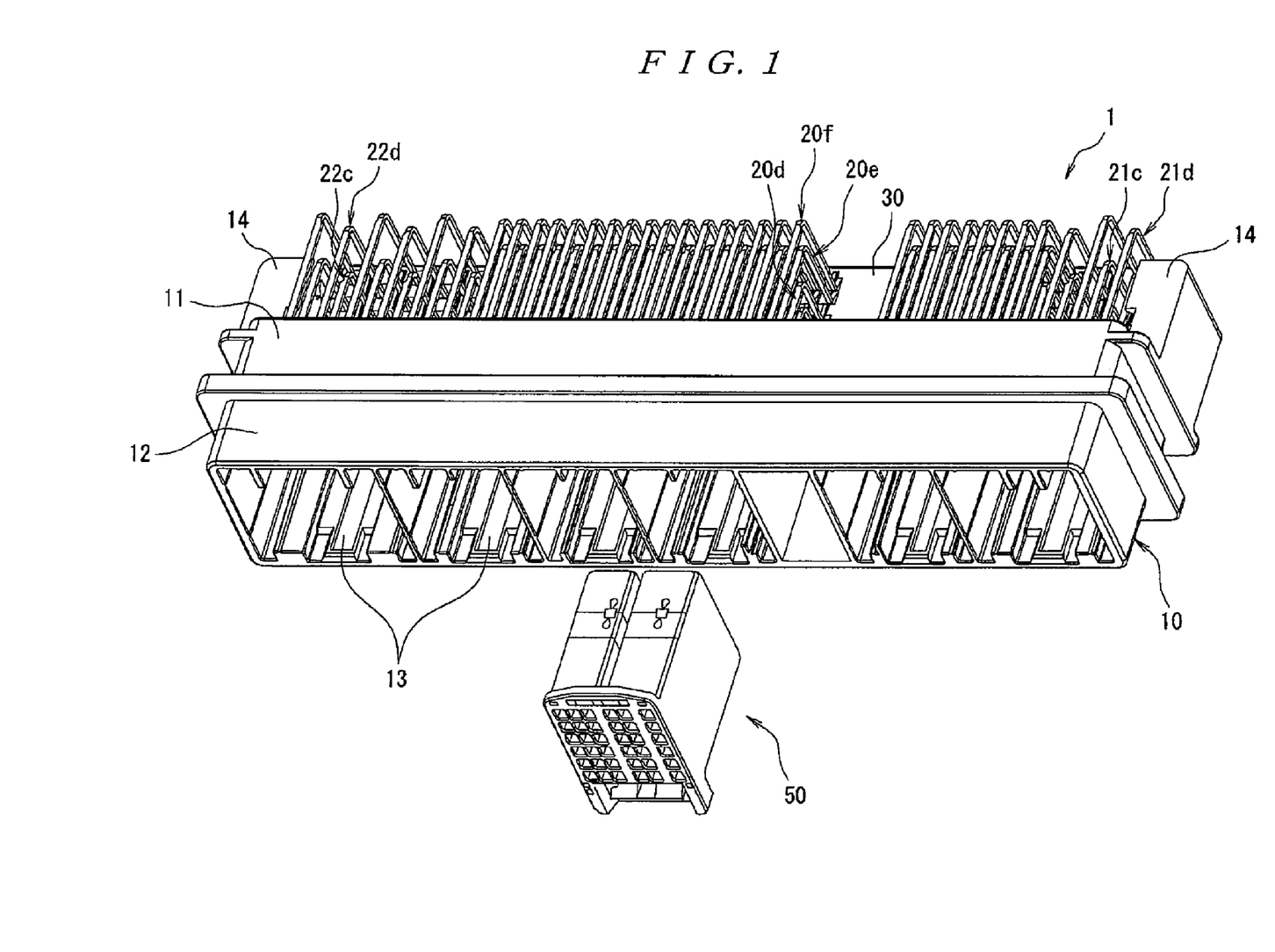
FIG. 1 is a perspective view of an electrical connector of the present invention shown with a mating connector prior to mating.

Next, an embodiment of the present invention will be described with reference to the figures. As shown in FIG. 1, the electrical connector 1 is designed such that a plurality of mating connectors 50 (only one of the mating connectors 50 is shown in FIG. 1) mate with the electrical connector 1. As shown in FIGS. 1 through 7, the electrical connector 1 comprises a housing 10, a tine plate 30, first contacts 20a, 20b, 20c, 20d, 20e, and 20f in a plurality of rows and columns (6 rows and 25 columns in the present embodiment), second contacts 21a, 21b, 21c, and 21d in a plurality of rows and columns (4 rows and 3 columns in the present embodiment), and third contacts 22a, 22b, 22c, and 22d in a plurality of rows and columns (4 rows and 6 columns in the present embodiment) which are secured to the housing 10. With regard to the first contacts, the first contacts 20a in a bottommost row in FIG. 3 are first-row first contacts, the first contacts 20b in a second row from the bottom are second-row first contacts, the first contacts 20c in a third row from the bottom are third-row first contacts, the first contacts 20d in a fourth row from the bottom are fourth-row first contacts, the first contacts 20e in a fifth row from the bottom are fifth-row first contacts, and the first contacts 20f in a topmost row are sixth-row first contacts. Furthermore, with regard to the second contacts, the second contacts 21a in a bottommost row in FIG. 3 are first-row second contacts, the second contacts 21b in a second row from the bottom are second-row second contacts, the second contacts 21c in a third row from the bottom are third-row second contacts, and the second contacts 21d in a topmost row are fourth-row second contacts. Moreover, with regard to the third contacts, the third contacts 22a in a bottommost row in FIG. 3 are first-row third contacts, the third contacts 22b in a second row from the bottom are second-row third contacts, the third contacts 22c in a third row from the bottom are third-row third contacts, and the third contacts 22d in a topmost row are fourth-row third contacts.

The housing 10 is formed by molding an insulating resin and comprises a substantially rectangular housing base 11 that extends in the direction of length (left-right direction in FIGS. 2 and 3), and a substantially rectangular mating member 12 that protrudes forward (toward the bottom in FIG. 2) from the housing base 11 and that extends in the direction of length. A plurality of mating connector mating recesses 13 (six of the recesses 13 in the present embodiment) with which the mating connectors 50 mate are formed in the mating member 12 of the housing 10. Moreover, a pair of locking members 14 for locking the tine plate 30 is provided on either end of the housing base 11 in the direction of length.

Figure 2:
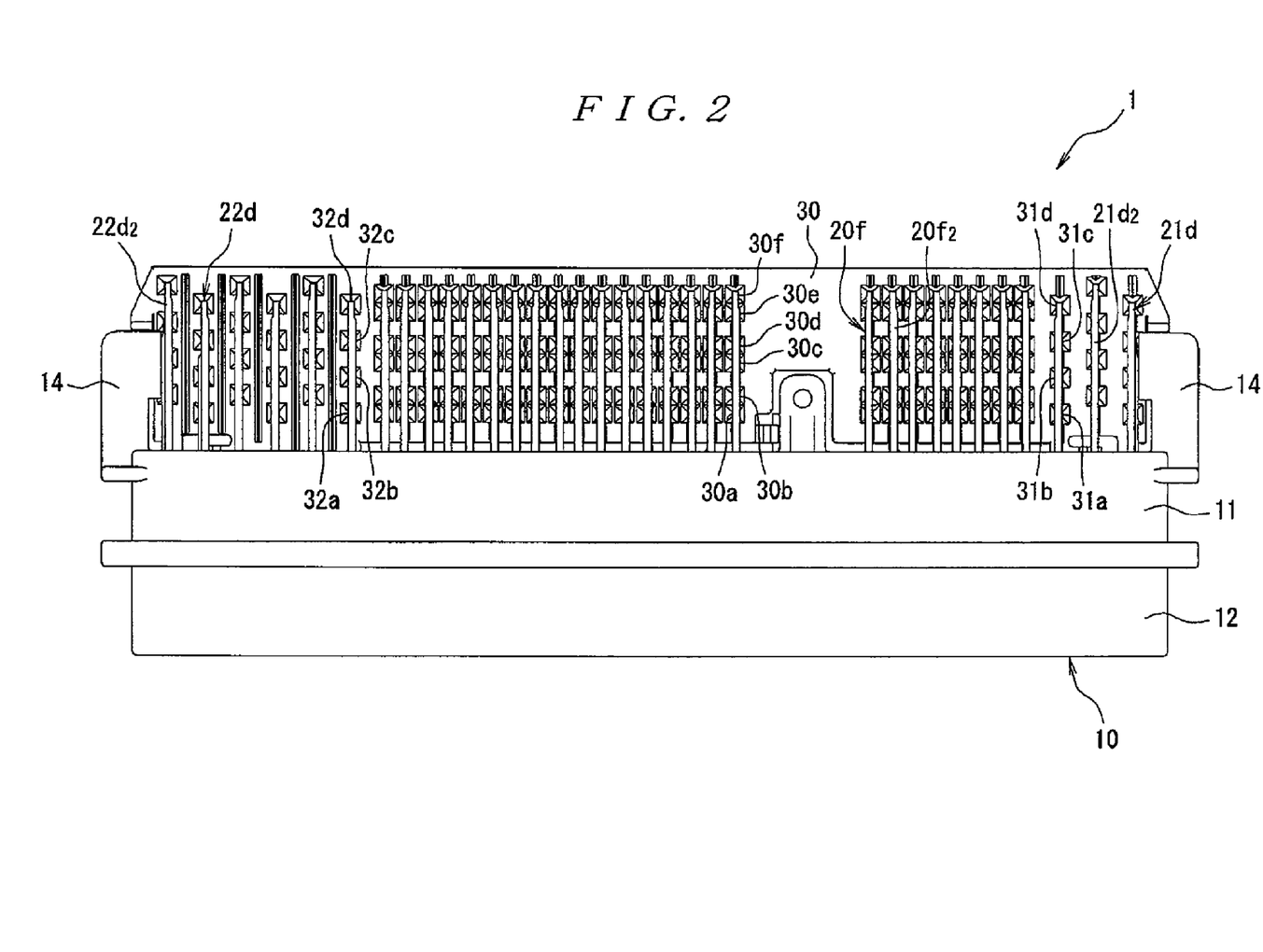
FIG. 2 is a plan view of the electrical connector shown in FIG. 1.
Figure 3:
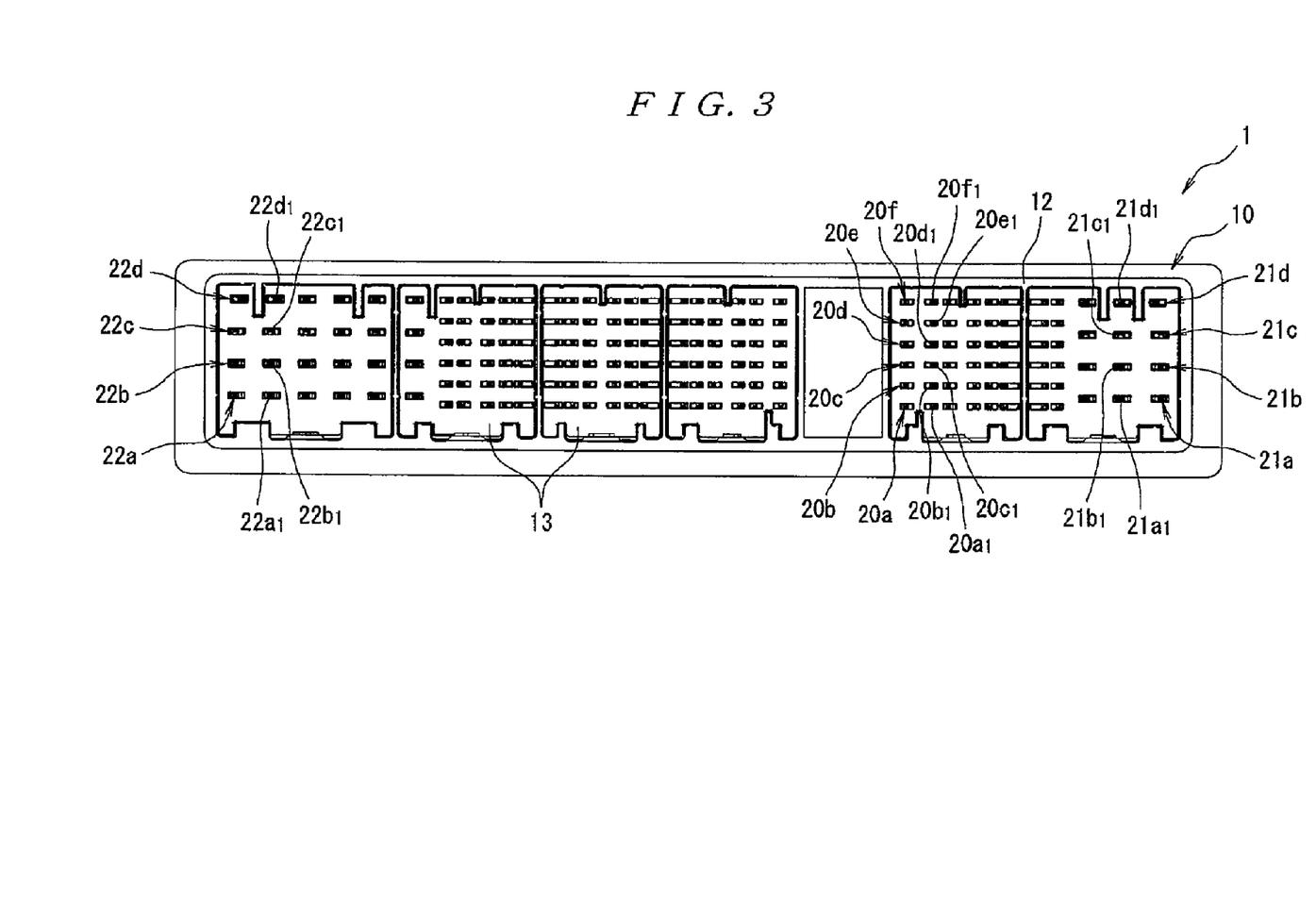
FIG. 3 is a front view of the electrical connector shown in FIG. 1.
Figure 4:
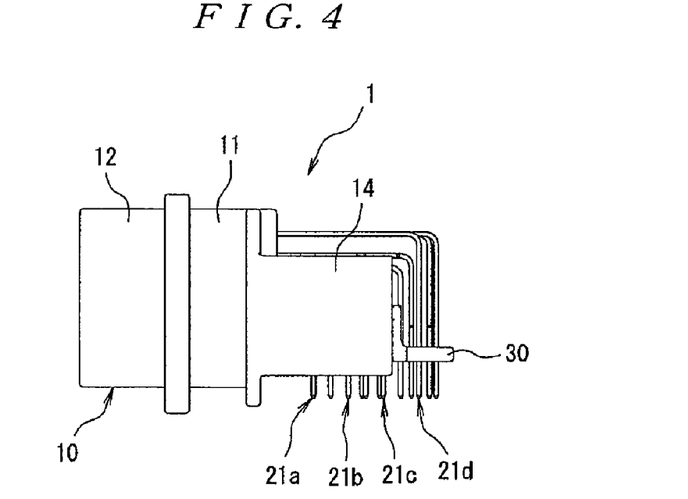
FIG. 4 is a right side view of the electrical connector shown in FIG. 1.
Figure 5:
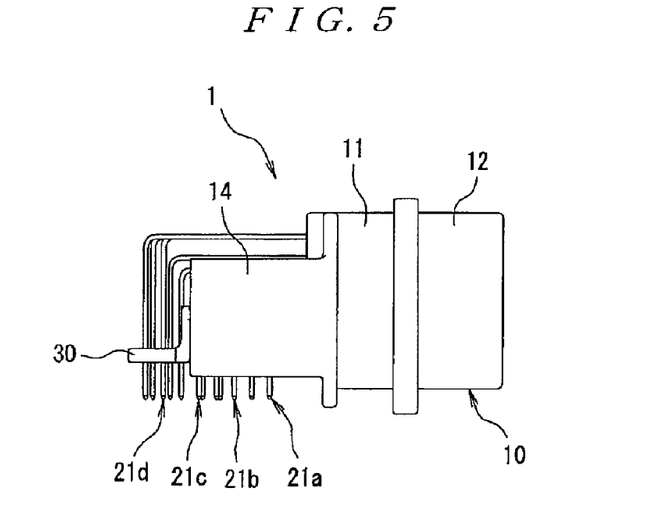
FIG. 5 is a left side view of the electrical connector shown in FIG. 1.

As shown in FIGS. 1 through 3, the first contacts 20a through 20f are attached substantially to a central portion of the housing 10 in a direction of length along the direction of length of the housing 10, the second contacts 21a through 21d are provided in a right end portion of the housing 10 in the direction of length along the direction of length of the housing 10, and the third contacts 22a through 22d are provided in a left end portion of the housing 10 in the direction of length along the direction of length of the housing 10.

Here, the first contacts 20a through 20f in the first through sixth rows are fastened to the housing base 11 and comprise contact members $20a_1$, $20b_1$, $20c_1$, $20d_1$, $20e_1$, and $20f_1$ (see FIG. 3) that extend into four mating connector mating recesses 13 located substantially in a central portion of the housing 10 in the direction of length. The first contacts 20a through 20f in the first through sixth rows also respectively comprise tines $20a_2$, $20b_2$, $20c_2$, $20d_2$, $20e_2$, and $20f_2$ (see FIG. 6) that respectively extend from the contact members $20a_1$ through $20f_1$ toward a rear of the housing base 11 (toward an outside of the housing 10 and upward in FIG. 2). The tines $20a_2$ through $20f_2$ are formed by being bent downward at a right angle after extending toward the rear of the housing base 11. Each of the first contacts 20a through 20f in the first through sixth rows is constructed from a pin member that is formed by stamping and forming a metal plate.

Figure 6:
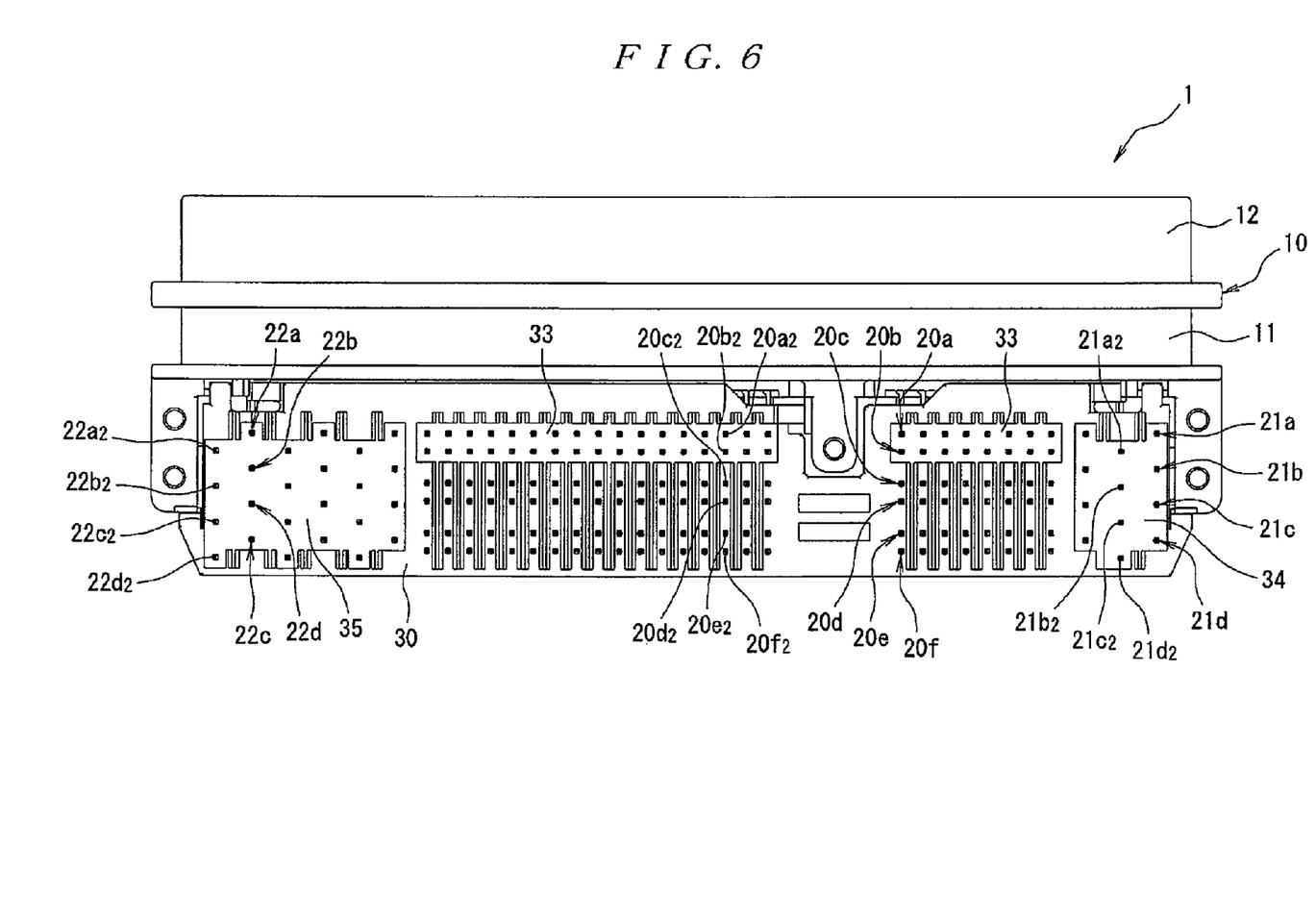
FIG. 6 is a bottom view of the electrical connector shown in FIG. 1.

The second contacts 21a through 21d in the first through fourth rows are fastened to the housing base 11 and comprise contact members $21a_1$, $21b_1$, $21c_1$, and $21d_1$ (see FIG. 3) that extend into the mating connector mating recess 13 located at a right end portion of the housing in the direction of length. The second contacts 21a through 21d in the first through fourth rows also respectively comprise tines $21a_2$, $21b_2$, $21c_2$, and $21d_2$ (see FIG. 6) that respectively extend from the contact members $21a_1$ through $21d_1$ toward the rear of the housing base 11 (toward the outside of the housing 10 and upward in FIG. 2). The tines $21a_2$ through $21d_2$ are formed by being bent downward at a right angle after extending toward the rear of the housing base 11. As shown in FIG. 6, the right-angled bent portions of the tines $21a_2$ through $21d_2$ of the second contacts 21a through 21d in the second column from the right side of the housing 10 in the direction of length respectively extend to positions that are shifted rearward with respect to the right-angled bent portions of the tines $21a_2$ through $21d_2$ of the second contacts 21a through 21d in the first and third columns, which are adjacent to the second column on both sides thereof. As a result, the right-angled bent portions of the tines $21a_2$ through $21d_2$ of the second contacts 21a through 21d in the respective rows are arranged in a staggered fashion along the direction of length of the housing 10. Furthermore, each of the second contacts 21a through 21d in the first through fourth rows is constructed from a pin member that is formed by stamping and forming a metal plate.

The third contacts 22a through 22d in the first through fourth rows are fastened to the housing base 11 and comprise contact members $22a_1$, $22b_1$, $22c_1$, and $22d_1$ (see FIG. 3) that extend into the mating connector mating recesses 13 located at a left end portion of the housing in the direction of length. The third contacts 22a through 22d in the first through fourth rows also respectively comprise tines $22a_2$, $22b_2$, $22c_2$, and $22d_2$ (see FIG. 6) that respectively extend from the contact members $22a_1$ through $22d_1$ toward the rear of the housing base 11 (toward the outside of the housing 10 and upward in FIG. 2). The respective tines $22a_2$ through $22d_2$ are formed by being bent downward at a right angle after extending toward the rear of the housing base 11. As shown in FIG. 6, the right-angled bent portions of the tines $22a_2$ through $22d_2$ of the third contacts 22a through 22d in the first, third, and fifth columns from the left side of the housing 10 in the direction of length respectively extend to positions that are shifted rearward with respect to the right-angled bent portions of the tines $22a_2$ through $22d_2$ of the third contacts 22a through 22d in the second, fourth, and sixth columns, which are adjacent to the first, third, and fifth columns on both sides thereof. As a result, the right-angled bent portions of the tines $22a_2$ through $22d_2$ of the third contacts 22a through 22d in the respective rows are arranged in a staggered fashion along the direction of length of the housing 10. In addition, each of the third contacts 22a through 22d in the first through fourth rows is constructed from a pin member that is formed by stamping and forming a metal plate.

Figure 7:
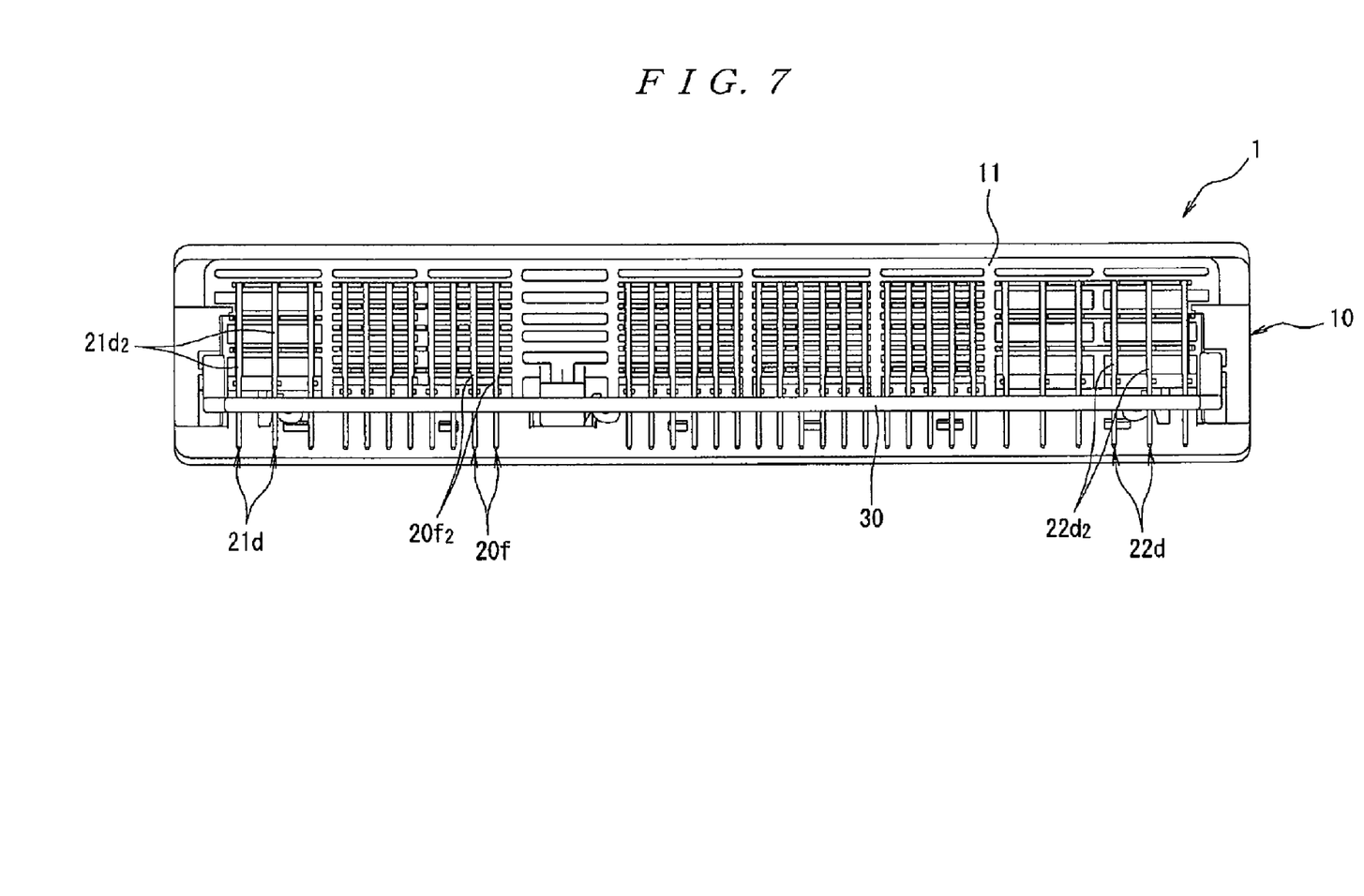
FIG. 7 is a back view of the electrical connector shown in FIG. 1.

As shown in FIGS. 2, 6, and 7, the tine plate 30 is constructed from a substantially rectangular plate-form body that extends in the direction of length (left-right direction in FIG. 2), and is formed by molding an insulating resin. As is shown in FIGS. 2 and 6, first through-holes 30a, 30b, 30c, 30d, 30e, and 30f in a plurality of rows and columns (6 rows and 25 columns in the present embodiment) into which the right-angled bent portions of the tines $20a_2$ through $20f_2$ of the first contacts 20a through 20f in the plurality of rows and columns are respectively inserted are formed in the tine plate 30. The first through-holes 30a through 30f are formed substantially in a central portion of the tine plate 30 in the direction of length along the direction of length of the tine plate 30 corresponding to the right-angled bent portions of the tines $20a_2$ through $20f_2$ of the first contacts 20a through 20f. The first through-holes 30a through 30f in the respective rows are arranged in a staggered fashion along the direction of length of the housing 10. Furthermore, the first through-holes 30a through 30f are formed in positions corresponding to first through-holes 40a through 40f (see FIG. 10) in a circuit board 40. With regard to the first through-holes 30a through 30f, the first through-holes 30a in a row closest to the housing 10 in FIG. 2 are first-row first through-holes, the first through-holes 30b in a second closest row are second-row first through-holes, the first through-holes 30c in a third closest row are third-row first through-holes, the first through-holes 30d in a fourth closest row are fourth-row first through-holes, the first through-holes 30e in a fifth closest row are fifth-row first through-holes, and the first through-holes 30f in a row farthest to the housing 10 are sixth-row first through-holes. Furthermore, tapered members 30a' and 30b' (only the tapered members 30a' and 30b' that are respectively provided in the first through-holes 30a and 30b in the first and second rows are shown in FIG. 11) for easily guiding the tines $20a_2$ through $20f_2$ into the through-holes 30a through 30f are provided in the respective first through-holes 30a through 30f on a side of the insertion of the tines $20a_2$ through $20f_2$.

Second through-holes 31a, 31b, 31c, and 31d in a plurality of rows and columns (4 rows and 3 columns in the present embodiment) into which the right-angled bent portions of the tines $21a_2$ through $21d_2$ of the second contacts 21a through 21d in the plurality of rows and columns are respectively inserted are formed in the tine plate 30. The second through-holes 31a through 31d are formed in a right end portion of the tine plate 30 in the direction of length along the direction of length of the tine plate 30 corresponding to the right-angled bent portions of the tines $21a_2$ through $21d_2$ of the second contacts 21a through 21d. The second through-holes 31a through 31d in the respective rows are arranged in a staggered fashion along the direction of length of the housing 10. Moreover, the second through-holes 31a through 31d are formed in positions corresponding to second through-holes (not shown in the figures) in the circuit board 40. With regard to the second through-holes 31a through 31d, the second through-holes 31a in a row closest to the housing 10 in FIG. 2 are first-row second through-holes, the second through-holes 31b in a second closest row are second-row second through-holes, the second through-holes 31c in a third closest row are third-row second through-holes, and the second through-holes 31d in a row farthest to the housing 10 are fourth-row second through-holes. Furthermore, tapered members (not shown in the figures) for easily guiding the tines $21a_2$ through $21d_2$ into the second through-holes 31a through 31d are provided in the second through-holes 31a through 31d on a side of the insertion of the tines $21a_2$ through $21d_2$.

Third through-holes 32a, 32b, 32c, and 32d in a plurality of rows and columns (4 rows and 6 columns in the present embodiment) into which the perpendicular portions of the respective tines $22a_2$ through $22d_2$ of the third contacts 22a through 22d in the plurality of rows and columns are respectively inserted are formed in the tine plate 30. The third through-holes 32a through 32d are formed in a left portion of the tine plate 30 in the direction of length along the direction of length of the tine plate 30 corresponding to the right-angled bent portions of the tines $22a_2$ through $22d_2$ of the third contacts 22a through 22d. The third through-holes 32a through 32$d$ in the respective rows are arranged in a staggered fashion along the direction of length of the housing 10. Furthermore, the third through-holes 32$a$ through 32$d$ are formed in positions corresponding to third through-holes (not shown in the figures) in the circuit board 40. With regard to the third through-holes 32$a$ through 32, the third through-holes 32$a$ in a row closest to the housing 10 in FIG. 2 are first-row third through-holes, the third through-holes 32$b$ in a second closest row are second-row third through-holes, the third through-holes 32$c$ in a third closest row are third-row third through-holes, and the third through-holes 32$d$ in a row farthest to the housing 10 are fourth-row third through-holes. In addition, tapered members (not shown in the figures) for easily guiding the tines 22$a_2$ through 22$d_2$ into the third through-holes 32$a$ through 32$d$ are provided in the third through-holes 32$a$ through 32$d$ on the side of the insertion of the tines 22$a_2$ through 22$d_2$.

The right-angled bent portions of the tines 20$a_2$ through 20$f_2$ of the first contacts 20$a$ through 20$f$ are respectively inserted into the first through-holes 30$a$ through 30$f$ in the tine plate 30. The first through-holes 30$a$ through 30$f$ have the function of aligning the inserted right-angled bent portions with the first through-holes formed in the circuit board 40. Similarly, the right-angled bent portions of the tines 21$a_2$ through 21$d_2$ of the second contacts 21$a$ through 21$d$ are respectively inserted into the second through-holes 31$a$ through 31$d$ in the tine plate 30. The second through-holes 31$a$ through 31$d$ have the function of aligning the inserted right-angled bent portions with the second through-holes formed in the circuit board 40. Moreover, the right-angled bent portions of the tines 22$a_2$ through 22$d_2$ of the third contacts 22$a$ through 22$d$ are respectively inserted into the third through-holes 32$a$ through 32$d$ in the tine plate 30. The third through-holes 32$a$ through 32$d$ have the function of aligning the inserted right-angled bent portions with the third through-holes formed in the circuit board 40. Furthermore, the tine plate 30 is designed to be locked with the locking members 14 provided on the housing 10 and to restrict the downward movement after the right-angled bent portions of the tines 20$a_2$ through 20$f_2$ of the first contacts 20$a$ through 20$f$ are respectively inserted into the first through-holes 30$a$ through 30$f$, the right-angled bent portions of the tines 21$a_2$ through 21$d_2$ of the second contacts 21$a$ through 21$d$ are respectively inserted into the second through-holes 31$a$ through 31$d$, and the right-angled bent portions of the tines 22$a_2$ through 22$d_2$ of the third contacts 22$a$ through 22$d$ are respectively inserted into the third through-holes 32$a$ through 32$d$.

As shown in FIGS. 2 and 6, first recesses 33 are formed in the undersurface of the tine plate 30 within regions encompassing all of the first through-holes 30$a$ and 30$b$ that are present within regions encompassing the first through-holes 30$a$ and 30$b$ in the first and second rows that are adjacent to the housing 10. The cross-sectional shape of each of the first recesses 33 is rectangular as shown in FIG. 11. The depth of the first recesses 33 is approximately 1 mm in the present embodiment. Furthermore, the thickness of the tine plate 30 is approximately 2 mm.

Similarly, as shown in FIGS. 2 and 6, a second recess 34 is formed in the undersurface of the tine plate 30 in a region encompassing all of the second through-holes 31$a$ through 31$d$ that are present within a region encompassing the second through-holes 31$a$ through 31$d$ in the three columns adjacent to the right end of the tine plate 30 in the direction of length. The cross-sectional shape of the second recess 34 is similar to the shape of the first recesses 33, and the depth of the second recess 34 is also approximately 1 mm.

Likewise, as shown in FIGS. 2 and 6, a third recess 35 is formed in the undersurface of the tine plate 30 in a region encompassing all of the third through-holes 32$a$ through 32$d$ that are present within a region which is 20% of the length of the tine plate 30 in the direction of length from the left end of the tine plate 30 in the direction of length. The cross-sectional shape of the third recess 35 is similar to the shape of the first recesses 33, and the depth of the third recess 35 is also approximately 1 mm.

Next, a method for mounting the electrical connector 1 on the circuit board 40 will be described with reference to FIGS. 8 through 11. First, prior to the mounting of the electrical connector 1 on the circuit board 40, the right-angled bent portions of the tines 20$a_2$ through 20$f_2$ of the first contacts 20$a$ through 20$f$ are respectively inserted into the first through-holes 30$a$ through 30$f$ in the tine plate 30, the right-angled bent portions of the tines 21$a_2$ through 21$d_2$ of the second contacts 21$a$ through 21$d$ are respectively inserted into the second through-holes 31$a$ through 31$d$, and the right-angled bent portions of the tines 22$a_2$ through 22$d_2$ of the third contacts 22$a$ through 22$d$ are respectively inserted into the third through-holes 32$a$ through 32$d$. Afterward, the tine plate 30 is locked with the locking members 14 provided on the housing 10.

Figure 8:
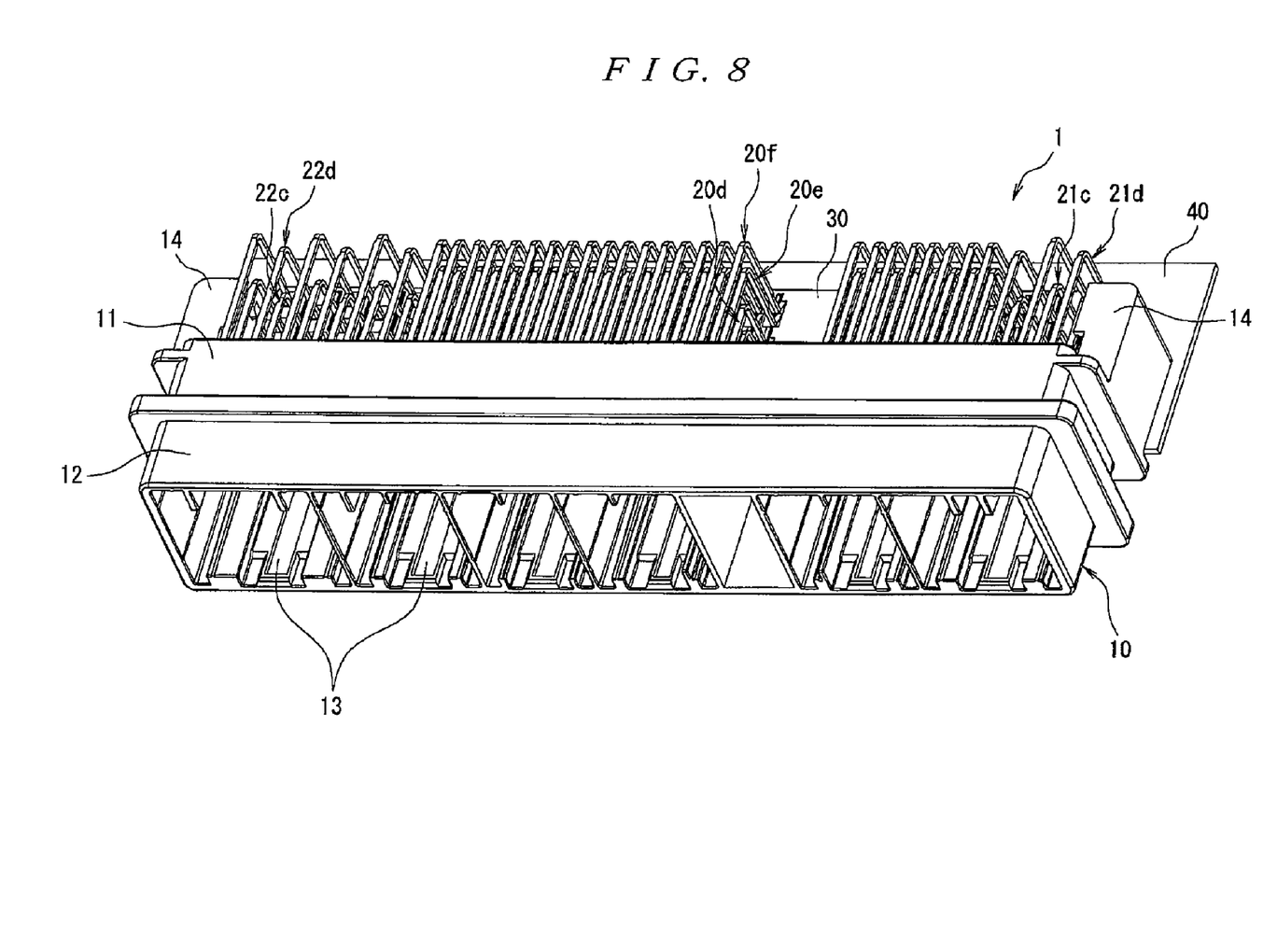
FIG. 8 is a perspective view of the electrical connector shown in FIG. 1 mounted on a circuit board.
Figure 9:
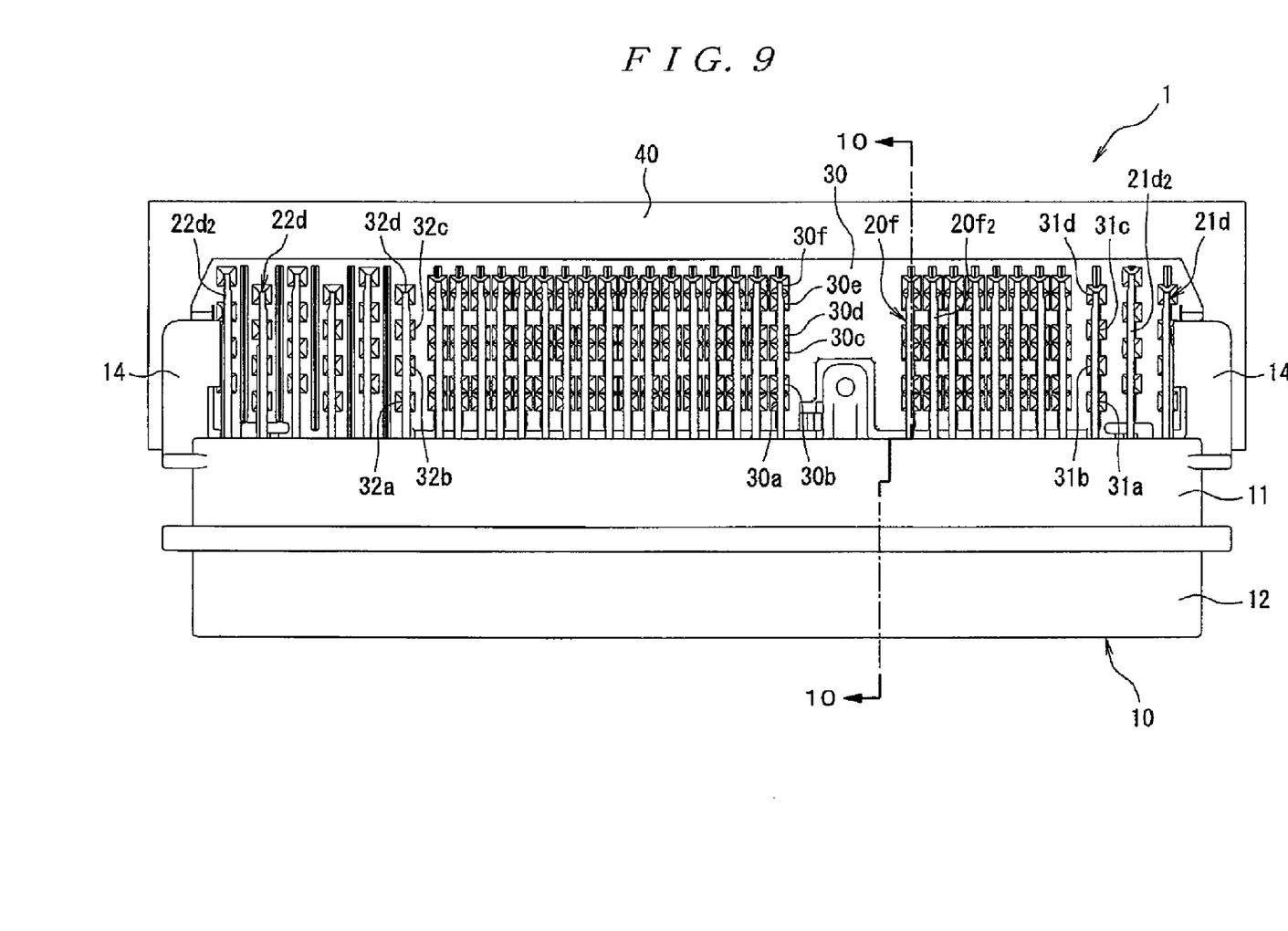
FIG. 9 is a plan view of the electrical connector and the circuit board shown in FIG. 8.
Figure 10:
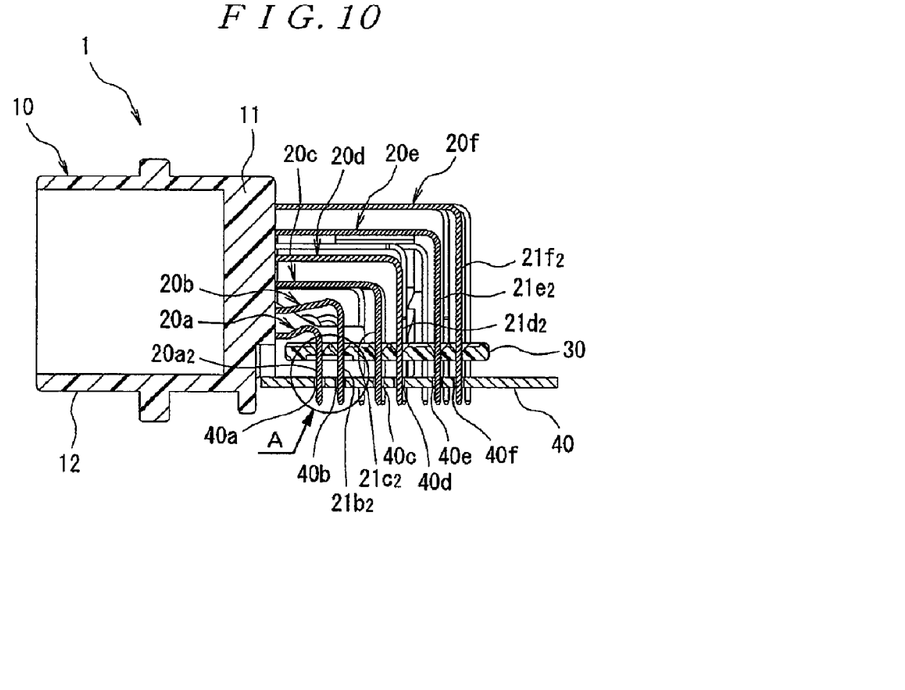
FIG. 10 is a sectional view along line 10-10 in FIG. 9.
Figure 11:
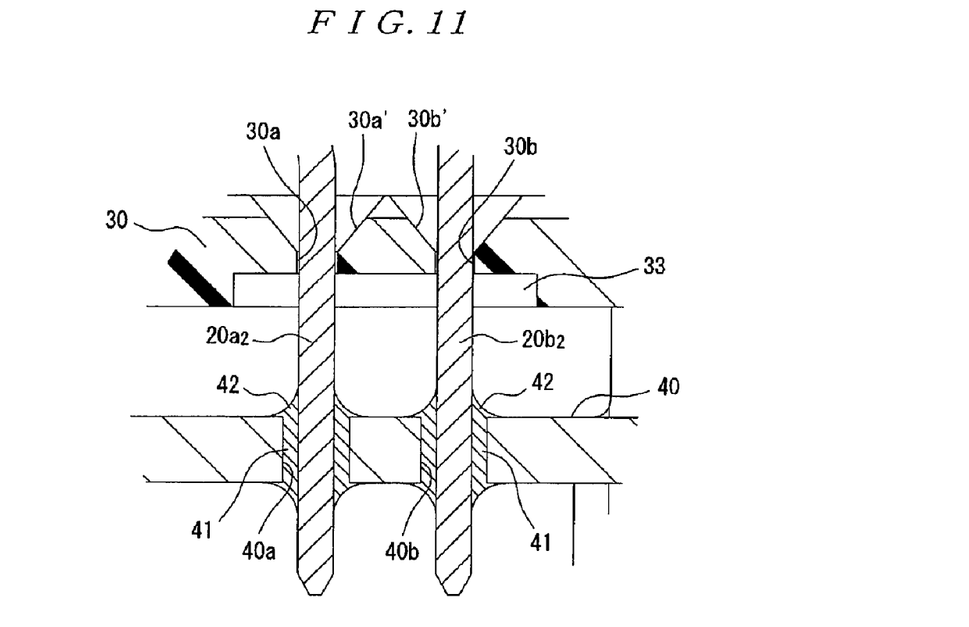
FIG. 11 is an enlarged view of area A in FIG. 10.

Then, as shown in FIGS. 8, 10, and 11, the right-angled bent portions of the tines 20$a_2$ through 20$f_2$ of the first contacts 20$a$ through 20$f$ are respectively inserted into the first through-holes 40$a$, 40$b$, 40$c$, 40$d$, 40$e$, and 40$f$ that are formed in the circuit board 40 at the same time, the right-angled bent portions of the tines 21$a_2$ through 21$d_2$ of the second contacts 21$a$ through 21$d$ are respectively inserted into the second through-holes (not shown in the figures) formed in the circuit board 40 at the same time, and the right-angled bent portions of the tines 22$a_2$ through 22$d_2$ of the third contacts 22$a$ through 22$d$ are respectively inserted into the third through-holes (not shown in the figures) formed in the circuit board 40 at the same time. As a result, the electrical connector 1 is carried on one end portion of the circuit board 40 as shown in FIG. 10. In this state, the undersurface of the tine plate 30 and the upper surface of the circuit board 40 are separated by a specified distance as shown in FIGS. 10 and 11. The specified distance is preferably greater than the so-called draw-up height (height of fillet 42), which is the level to which molten solder 41 crawls up and reaches the tine surfaces from the upper surface of the circuit board 40 due to surface tension.

In the insertion of the right-angled bent portions of the tines 20$a_2$ through 20$f_2$, 21$a_2$ through 21$d_2$, and 22$a_2$ through 22$d_2$, the first through-holes 30$a$ through 30$f$ in the tine plate 30 respectively align the right-angled bent portions of the tines 20$a_2$ through 20$f_2$ with the first through-holes 40$a$ through 40$f$, the second through-holes 31$a$ through 31$d$ respectively align the right-angled bent portions of the tines 21$a_2$ through 21$d_2$ with the second through-holes (not shown in the figures), and the third through-holes 32$a$ through 32$d$ respectively align the right-angled bent portions of the tines 22$a_2$ through 22$d_2$ with the third through-holes (not shown in the figures). Therefore, the insertion of the respective right-angled bent portions is performed smoothly.

Then, as shown in FIG. 11 (only the solder connection in the first through-holes 40$a$ through 40$f$ is shown in FIG. 11), the soldering of the right-angled bent portions of the tines 20$a_2$ through 20$f_2$, the right-angled bent portions of the tines 21$a_2$ through 21$d_2$, and the right-angled bent portions of the tines 22$a_2$ through 22$d_2$ is respectively performed in the first through-holes 40$a$ through 40$f$, the second through-holes (not shown in the figures), and the third through-holes (not shown in the figures). As a result, the first contacts 20a through 20f, the second contacts 21a through 21d, and the third contacts 22a through 22d of the electrical connector 1 are electrically connected to the circuit board 40.

When soldering is performed as described above, a capillary action occurs in each of the first through-holes 40a through 40f, the second through-holes (not shown in the figures), and the third through-holes (not shown in the figures). As a result, as is shown in FIG. 11, the molten solder 41 moves up to the upper surface of the circuit board 40 inside the first through-holes 40a through 40f, the second through-holes (not shown in the figures), and the third through-holes (not shown in the figures) in the circuit board 40 due to the capillary action. Furthermore, the molten solder 41 draws up the right-angled bent portions of the respective tines $20a_2$ through $20f_2$, $21a_2$ through $21d_2$, and $22a_2$ through $22d_2$ from the upper surface of the circuit board 40 due to the surface tension, and the tip end of the molten solder 41 in each of the first through-holes 40a through 40f, the second through-holes (not shown in the figures), and the third through-holes (not shown in the figures) forms the fillet 42 that reaches the vicinity of the halfway position between the tine plate 30 and the circuit board 40. Thus, because the tine plate 30 and the circuit board 40 are separated by a specified distance, i.e., a distance greater than the so-called draw-up height (height of the fillet 42), which is the level to which the molten solder 41 crawls up and reaches the tine surfaces from the upper surface of the circuit board 40 due to the surface tension, the fillet 42 of the molten solder 41 do not encroach on the tine plate 30.

Here, as is shown in FIGS. 2, 6, and 11, the first recesses 33 are formed in the undersurface of the tine plate 30 in regions encompassing all of the first through-holes 30a and 30b that are present within regions encompassing the first through-holes 30a and 30b in the first and second rows that are adjacent to the housing 10. Therefore, the distance between the circuit board 40 and the undersurface of the tine plate 30 can be made greater than in the past in the regions in which the first recesses 33 are formed and which encompass the first through-holes 30a and 30b, so that the fillet 42 of the molten solder 41 drawing up the tines $20a_2$ and $20b_2$ when the tines $20a_2$ and $20b_2$ are connected by soldering to the circuit board 40 can be reliably prevented from encroaching on the tine plate 30 in the portions where the first recesses 33 are formed.

Moreover, as is shown in FIGS. 2 and 6, the second recess 34 is formed in the undersurface of the tine plate 30 in a region encompassing all of the second through-holes 31a through 31d that are present within a region encompassing the second through-holes 31a through 31d in the three columns adjacent to the right end of the tine plate 30 in the direction of length. Therefore, the distance between the circuit board 40 and the undersurface of the tine plate 30 can be made greater than in the past in the region in which the second recess 34 is formed and which encompasses the second through-holes 31a through 31d, so that the fillet 42 of the molten solder 41 that draws up the tines $21a_2$ through $21d_2$ when the tines $21a_2$ through $21d_2$ are connected by soldering to the circuit board 40 can be reliably prevented from encroaching on the tine plate 30 in the portion where the second recess 34 is formed.

In addition, as is shown in FIGS. 2 and 6, the third recess 35 is formed in the undersurface of the tine plate 30 in a region encompassing all of the third through-holes 32a through 32d that are present within a region which is 20% of the length of the tine plate 30 in the direction of length from the left end of the tine plate 30 in the direction of length. Therefore, the distance between the circuit board 40 and the undersurface of the tine plate 30 can be made greater than in the past in the region in which the third recess 35 is formed and which encompasses the third through-holes 32a through 32d, so that the fillet 42 of the molten solder 41 that draws up the tines $22a_2$ through $22d_2$ when the tines $22a_2$ through $22d_2$ are connected by soldering to the circuit board 40 can be reliably prevented from encroaching on the tine plate 30 in the portion where the third recess 35 is formed.

Furthermore, the first recesses 33, the second recess 34, and the third recess 35 formed in the undersurface of the tine plate 30 are formed in the undersurface of the tine plate 30 in regions encompassing some of the through-holes among the first through-holes 30a through 30f, second through-holes 31a through 31d, and third through-holes 32a through 32d in the plurality of rows and columns. Accordingly, there is no drop in the mechanical strength of the tine plate 30.

Here, in cases where the thermal expansion coefficients of the tine plate 30 and circuit board 40 are different, a difference is generated between the amounts of expansion and contraction of the tine plate 30 and the amounts of expansion and contraction of the circuit board 40 by the variations in the temperature, and stress is repeatedly generated in the parts soldered to the circuit board 40 via the tines $20a_2$ through $20f_2$, $21a_2$ through $21d_2$, and $22a_2$ through $22d_2$, so that cracking may occur in these soldered parts. Meanwhile, the tines $20a_2$ and $20b_2$ that are shorter in length among the tines $20a_2$ through $20f_2$ of the first contacts 20a through 20f in the plurality of rows and columns are respectively inserted into the first through-holes 30a and 30b that are present within the regions encompassing the first through-holes 30a and 30b in the two rows adjacent to the housing 10. Therefore, these portions where the first through-holes 30a and 30b are present are portions where the tine plate 30 is more predisposed to restraint than the other portions. That is, because the shorter tines $20a_2$ and $20b_2$ are less likely to undergo deformation than the longer tine parts, the tine plate 30 is more predisposed to restraint in the portions having the first through-holes 30a and 30b into which the shorter tines $20a_2$ and $20b_2$ are inserted than in the other portions.

Accordingly, in cases where the circuit board 40 and tine plate 30 thermally expand due to the temperature variations, the expansion and contraction of the portions of the tine plate 30 which have the first through-holes 30a and 30b that are present within the regions encompassing the first through-holes 30a and 30b in the two rows adjacent to the housing 10 are more easily restrained, and the difference from the amounts of expansion and contraction of the circuit board 40 is increased, so that an excessive force is applied to the tines $20a_2$ and $20b_2$ from the tine plate 30, resulting in a problem in that the stress on the soldered parts is increased. Thus, because the first recesses 33 are formed in regions encompassing all of the first through-holes 30a and 30b that are present within regions encompassing the first through-holes 30a and 30b in the two rows adjacent to the housing 10, the restraint of the expansion and contraction of these portions having the first through-holes 30a and 30b can be alleviated in cases where the tine plate 30 thermally expands due to the temperature variations; as a result, stress on the soldered parts can be reduced.

Furthermore, the third recess 35 is formed in a region encompassing all of the third through-holes 32a through 32d that are present within a region which is 20% of the length of the tine plate 30 in the direction of length from the left end of the tine plate 30 in the direction of length. Moreover, the second recess 34 is formed in a region encompassing all of the second through-holes 31a through 31d that are present within a region encompassing the second through-holes 31a through 31d in the three columns adjacent to the right end of the tine plate 30 in the direction of length. In cases where the thermal expansion coefficients of the tine plate 30 and circuit board 40 are different as described above, a difference is generated between the amounts of expansion and contraction of the tine plate 30 and the amounts of expansion and contraction of the circuit board 40 by the variations in the temperature, and stress is repeatedly generated in the parts soldered to the circuit board 40 via the tines $20a_2$ through $20f_2$, $21a_2$ through $21d_2$, and $22a_2$ through $22d_2$, so that cracking may occur in these soldered parts. Here, in cases where thermal expansion takes place due to the temperature variations, the amounts of expansion and contraction in the direction of length of the tine plate 30 are accumulated within the region that is 20% of the length of the tine plate 30 in the direction of length from the left end of the tine plate 30 in the direction of length and within the region encompassing the second through-holes 31a through 31d in the three columns adjacent to the right end of the tine plate 30 in the direction of length, so that these amounts of expansion and contraction are large.

Accordingly, in cases where the circuit board 40 and tine plate 30 thermally expand due to the temperature variations, the amounts of expansion and contraction become too large in the portion having the third through-holes 32a through 32d that are present within the region which is 20% of the length of the tine plate 30 in the direction of length from the left end of the tine plate 30 in the direction of length and in the portion having the second through-holes 31a through 31d that are present within a region encompassing the second through-holes 31a through 31d in the three columns adjacent to the right end of the tine plate 30 in the direction of length, so that the difference from the amounts of expansion and contraction of the circuit board 40 become large. As a result, an excessive force is applied to the tines $21a_2$ through $21d_2$ and $22a_2$ through $22d_2$, creating the problem of increasing the stress on the soldered parts. Accordingly, by forming the third recess 35 in the region encompassing all of the third through-holes 32a through 32d that are present within a region which is 20% of the length of the tine plate 30 in the direction of length from the left end of the tine plate 30 in the direction of length, and by forming the second recess 34 in the region encompassing all of the second through-holes 31a through 31d that are present within a region encompassing the second through-holes 31a through 31d in the three columns adjacent to the right end of the tine plate 30 in the direction of length, it is possible to reduce the amounts of expansion and contraction of the portions having these third through-holes 32a through 32d and second through-holes 31a through 31d in cases where the tine plate 30 thermally expands due to the temperature variations; as a result, the stress on the soldered parts can be reduced.

An embodiment of the present invention has been described above. However, the present invention is not limited to this embodiment, and various alterations and modifications can be made. For example, the arrangement of the through-holes formed in the tine plate 30 is not limited to a plurality of rows and columns, and may also be in a single row and a plurality of columns or in a plurality of rows and a single column. Furthermore, the recesses formed in the undersurface of the tine plate 30 are not limited to the first recesses 33 formed in regions encompassing all of the first through-holes 30a and 30b that are present within regions encompassing the first through-holes 30a and 30b in the first and second rows adjacent to the housing 10, the second recess 34 formed in a region encompassing all of the second through-holes 31a through 31d that are present within a region encompassing the second through-holes 31a through 31d in the three columns adjacent to the right end of the tine plate 30 in the direction of length, and the third recess 35 formed in a region encompassing all of the third through-holes 32a through 32d that are present within a region which is 20% of the length of the tine plate 30 in the direction of length from the left end of the tine plate 30 in the direction of length. It is sufficient if the recesses are formed in the undersurface of the tine plate 30 in regions encompassing some of the through-holes among the first through-holes 30a through 30f, the second through-holes 31a through 31d, and the third through-holes 32a through 32d in a plurality of rows and columns. In this case, the distance between the circuit board 40 and the undersurface of the tine plate 30 can be made greater than in the past in regions encompassing the through-holes where the recesses are formed, so that the fillet 42 of the molten solder 41 drawing up the tines when the tines $20a_2$ through $20f_2$, $21a_2$ through $21d_2$, and $22a_2$ through $22d_2$ are connected by soldering to the circuit board 40 can be reliably prevented from encroaching on the tine plate 30 in the portions where the recesses are formed. Moreover, because the recesses are formed in the undersurface of the tine plate 30 in regions encompassing some through-holes among the first through-holes 30a through 30f, the second through-holes 31a through 31d, and the third through-holes 32a through 32d in a plurality of rows and columns, there is no drop in the mechanical strength of the tine plate 30.

In addition, the recesses formed in the undersurface of the tine plate 30 are not limited to the first recesses 33, the second recess 34, and the third recess 35; it would also be possible to form a recess in a region encompassing the first through-holes, the second through-holes, or the third through-holes that are present in a portion near the housing 10. In this case, it is possible to alleviate the restraint on the expansion and contraction of the portion of the tine plate 30 that has the first through-holes, the second through-holes, or the third through-holes that are present near the housing 10 in cases where the tine plate 30 thermally expands due to the temperature variations; as a result, the stress on the soldered parts can be reduced.

Furthermore, the formation of the first recesses 33 is not limited to regions encompassing all of the first through-holes 30a and 30b that are present within regions encompassing the first through-holes 30a and 30b in the first and second rows adjacent to the housing 10; it would also be possible to form the first recess 33 in a region encompassing either one or a plurality of the first through-holes 30a and 30b. In this case, it is possible to alleviate the restraint on the expansion and contraction of the portion having either one or a plurality of the first through-holes 30a and 30b present within regions encompassing the first through-holes 30a and 30b in the two rows adjacent to the housing 10 in cases where the tine plate 30 thermally expands due to the temperature variations; as a result, the stress on the soldered parts can be reduced.

Moreover, the recesses formed in the undersurface of the tine plate 30 are not limited to the first recesses 33, second recess 34, and third recess 35, and may also be formed in regions encompassing the second through-holes 31a through 31d and the third through-holes 32a through 32d that are present in either end portion of the tine plate 30 in the direction of length. In this case, it is possible to reduce the amounts of expansion and contraction of the portions having the second through-holes 31a through 31d and the third through-holes 32a through 32d that are present in either end portion of the tine plate 30 in the direction of length in cases where the tine plate 30 thermally expands due to the temperature variations; as a result, the stress on the soldered parts can be reduced.

In addition, the formation of the third recess 35 is not limited to a region encompassing all of the third through-holes 32a through 32d that are present within a region which is 20% of the length of the tine plate 30 in the direction of length from the left end of the tine plate 30 in the direction of length; the third recess 35 may also be formed in a region encompassing either one or a plurality of the third through-holes 32a through 32d. In this case, it is possible reduce the amounts of expansion and contraction of the portion having one or a plurality of the third through-holes 32a through 32d present within a region which is 20% of the length of the tine plate 30 in the direction of length from the left end of the tine plate 30 in the direction of length in cases where the tine plate 30 thermally expands due to the temperature variations; as a result, the stress on the soldered parts can be reduced.

Furthermore, the formation of the second recess 34 is not limited to a region encompassing all of the second through-holes 31a through 31d that are present within a region encompassing the second through-holes 31a through 31d in the three columns adjacent to the right end of the tine plate 30 in the direction of length; the second recess 34 may also be formed in a region encompassing either one or a plurality of the second through-holes 31a through 31d. In this case, it is possible to reduce the amounts of expansion and contraction of the portion having one or a plurality of the second through-holes 31a through 31d present within a region encompassing the second through-holes 31a through 31d in the three columns adjacent to the right end the tine plate 30 in the direction of length in cases where the tine plate 30 thermally expands due to the temperature variations; as a result, the stress on the soldered parts can be reduced.

The invention claimed is:

1. An electrical connector, comprising:
an insulating housing provided with a plurality of first contacts, each of the first contacts having a tine that extends toward an outside of the insulating housing that is bent at a right angle with respect thereto; and
a tine plate mounted on a side of the insulating housing at least one locking member,
wherein the tine plate includes a plurality of first through-holes, a plurality of second through-holes and a plurality of third through-holes that extend from an upper surface to an undersurface of the tine plate, in which the tines extend through the first through-holes, the second through-holes and the third through-holes, and
at least one recess provided on the undersurface of the tine plate that encompasses at least one of the first through-holes located in a portion near the housing, the second through-holes, or the third through-holes.

2. The electrical connector of claim 1, wherein the first through-holes in the tine plate are arranged in a plurality of rows extending in a direction of length of the insulating housing, the first through-holes in at least the first and second rows closest to the insulating housing being encompassed by the first recess.

3. The electrical connector of claim 1, wherein the first recess provided on the undersurface of the tine plate encompasses more than one of the first through-holes.

4. The electrical connector of claim 1, wherein the tine plate has a thickness that extends from the undersurface to the upper surface of the tine plate and the first recess has a depth from the undersurface of the tine plate toward the upper surface of the tine plate of about half the thickness of the tine plate.

5. The electrical connector of claim 1, wherein the first through-holes have a tapered member on the upper surface of the tine plate.

6. The electrical connector of claim 1, wherein the tine plate is constructed from a substantially rectangular plate-form body having a planar top surface extending in a direction of length of the insulating housing.

7. The electrical connector of claim 1, wherein a thickness of the tine plate is approximately 2 mm.

8. The electrical connector of claim 1, further comprising a circuit board arranged adjacent to the undersurface of the tine plate and spaced there from, the circuit board having a plurality of first through-holes corresponding to the first through-holes in the tine plate, the tines extending through the first through-holes in the circuit board.

9. The electrical connector of claim 8, wherein molten solder is provided in the first through-holes in the circuit board and forms a fillet on the tines that extends toward the undersurface of the tine plate.

10. The electrical connector of claim 1, wherein the tine plate includes a plurality of second through-holes that extend from the upper surface to the undersurface of the tine plate that receive tines of second contacts and a plurality of third through-holes that extend from the upper surface to the undersurface of the tine plate that receive tines of third contacts, the first through-holes being arranged between the second through-holes and the third through-holes.

11. The electrical connector of claim 10, wherein a second recess is provided on the undersurface of the tine plate and encompasses at least one of the second through-holes and a third recess is provided on the undersurface of the tine plate and encompasses at least one of the third through-holes.

12. The electrical connector of claim 11, wherein the second recess encompasses all of the second through-holes and the third recess encompasses all of the third through-holes.

13. The electrical connector of claim 12, wherein the third through-holes in the tine plate cover about 20% of the tine plate with respect to a direction of length of the tine plate.

14. The electrical connector of claim 8, wherein the tine plate and the circuit board are separated by a distance greater than a draw-up height.

15. The electrical connector of claim 14, wherein the draw-up height is the level to which molten solder draws up a tine surface due to surface tension.

* * * * *